(12) United States Patent
Cheng et al.

(10) Patent No.: US 12,176,869 B2
(45) Date of Patent: Dec. 24, 2024

(54) RECONFIGURABLE POWER AMPLIFIER BASED ON PIN SWITCH AND DESIGN METHOD THEREOF

(71) Applicants: Hangzhou Dianzi University, Zhejiang (CN); Hangzhou Dianzi University Fuyang Electronic Information Research Institute Co., Ltd., Zhejiang (CN)

(72) Inventors: Zhiqun Cheng, Zhejiang (CN); Songye Wang, Zhejiang (CN); Chao Le, Zhejiang (CN); Ze Qin, Zhejiang (CN); Xiebin Huang, Zhejiang (CN); Yelong Jian, Zhejiang (CN); Guohua Liu, Zhejiang (CN)

(73) Assignees: Hangzhou Dianzi University, Hangzhou (CN); Hangzhou Dianzi University Fuyang Electronic Information Research Institute Co., Ltd.

( * ) Notice: Subject to any disclaimer, the term of this patent is extended or adjusted under 35 U.S.C. 154(b) by 483 days.

(21) Appl. No.: 17/574,238

(22) Filed: Jan. 12, 2022

(65) Prior Publication Data
US 2022/0368296 A1 Nov. 17, 2022

(30) Foreign Application Priority Data
May 10, 2021 (CN) .......................... 202110504380.2

(51) Int. Cl.
| | | |
|---|---|---|
| *H03F 3/24* | (2006.01) | |
| *H03F 1/56* | (2006.01) | |
| *H03F 3/195* | (2006.01) | |

(52) U.S. Cl.
CPC ............... *H03F 3/245* (2013.01); *H03F 1/56* (2013.01); *H03F 3/195* (2013.01); *H03F 2200/451* (2013.01)

(58) Field of Classification Search
CPC . H03F 3/245; H03F 3/195; H03F 1/56; H03F 2200/451
See application file for complete search history.

(56) References Cited

U.S. PATENT DOCUMENTS

| | | | | |
|---|---|---|---|---|
| 2014/0266460 A1* | 9/2014 | Nobbe | .................... | H03F 3/245 330/295 |
| 2014/0347125 A1* | 11/2014 | Mohamed | ............. | H03F 1/0288 330/124 R |

(Continued)

*Primary Examiner* — Patricia T Nguyen
(74) *Attorney, Agent, or Firm* — Day Pitney LLP; George Chaclas; Anthony A. Kassas (57) ABSTRACT

The present disclosure provides a reconfigurable power amplifier (PA) based on a PIN switch and a design method thereof. The reconfigurable PA based on a PIN switch includes an input port, an input matching circuit, the PIN switch, a gate bias circuit, a transistor, a drain bias circuit, an output matching circuit and an output port, where the input matching network includes an input end connected to a power input end, and an output end connected to a gate of the transistor, the gate bias circuit is connected in parallel with the gate, the drain bias circuit is connected in parallel with a drain, the drain of the transistor is connected to an input end of the output matching circuit, and an output end of the output matching circuit serves as a power output.

6 Claims, 8 Drawing Sheets

(56) References Cited

U.S. PATENT DOCUMENTS

| | | | | |
|---|---|---|---|---|
| 2015/0372541 A1* | 12/2015 | Guo | ............... | H02M 7/217 |
| | | | | 307/104 |
| 2018/0123533 A1* | 5/2018 | Campbell | ............... | H03H 7/383 |
| 2022/0085776 A1* | 3/2022 | Cao | ............... | H03F 1/565 |
| 2022/0158594 A1* | 5/2022 | Nikandish | ............... | H03F 3/72 |

* cited by examiner

RECONFIGURABLE POWER AMPLIFIER BASED ON PIN SWITCH AND DESIGN METHOD THEREOF

CROSS REFERENCE TO RELATED APPLICATION

This patent application claims the benefit and priority of Chinese Patent Application No. 202110504380.2, filed on May 10, 2021, the disclosure of which is incorporated by reference herein in its entirety as part of the present application.

TECHNICAL FIELD

The present disclosure relates to the field of radio-frequency (RF) circuit designs, and in particular, to a reconfigurable power amplifier (PA) based on a PIN switch and a design method thereof.

BACKGROUND ART

From the emergence to verification and to rapid development in the past 20 years, wireless communication has become an indispensable tool for human society, e.g., mobile phones, Bluetooth devices, wireless local area network (WLAN) devices and satellite communication systems are all important applications of the wireless communication and have been integrated into the mankind's daily life. As an important part in wireless communication systems, a last procedure of antenna transmission in uplink and a last procedure of antenna reception in downlink, PAs are inevitably facing the challenge to work in multi-mode multi-band (MMMB) environments. Reconfigurable PAs can be switched among different modes and bands under the control of reconfigurable devices. With the simple structure and excellent performance, the reconfigurable PAs can facilitate the better development of the wireless communication systems. There have been a number of reports on the reconfigurable PAs. In 2018, with a comb filter at the output end, a continuous and reconfigurable Doherty power amplifier (DPA) working at 0.725 GHz to 1.225 GHz was presented by Kong Xiaoxiao; and test results indicate that the efficiency is more than 35% and the gain is more than 9 dB. In general, existing reconfigurable PAs are designed complicatedly, the reconfigurable devices are designed hardly with great influences on the circuits, the matching circuits of the reconfigurable PAs are structured simply, and the reconfigurable PAs are obstructed by difficult debugging.

Therefore, there is a need to provide a reconfigurable PA based on a PIN switch and a design method thereof, to solve the problems in the prior art.

SUMMARY

In view of this, an objective of the present disclosure is to provide a reconfigurable PA based on a PIN switch and a design method thereof. The present disclosure changes the structure of the output matching circuit network by changing a working state of the PIN switch in the output matching circuit, thereby implementing the reconfigurable function, and achieving desirable working performance of the PA at different modes and bands; and in order to further improve the performance of the reconfigurable PA, the present disclosure uses the same method to design the input matching circuit.

The present disclosure uses the following technical solutions to overcome the defects in the prior art:

A reconfigurable PA based on a PIN switch includes an input port, a reconfigurable input matching network, a gate bias network, a transistor, the PIN switch, a drain bias network, a reconfigurable output matching network and an output port, where the reconfigurable input matching network includes an input end adapted and connected to the input port, and an output end connected to a gate of the transistor, and the gate bias circuit is connected in parallel with the gate of the transistor;

a drain of the transistor is connected in parallel with the drain bias circuit, and connected to an input end of the reconfigurable output matching network;

the reconfigurable input matching circuit includes a trunk microstrip and reconfigurable structures;

the trunk microstrip is respectively connected to the input port, the transistor and the bias circuits, and the trunk microstrip is connected to a plurality of reconfigurable structures;

the reconfigurable structures each are composed of a PIN switch and a microstrip by connecting in series; and the output port is adapted and connected to the reconfigurable output matching circuit.

The reconfigurable output matching network may include a reconfigurable structure composed of a PIN switch and a microstrip.

There may be four reconfigurable structures in total in reconfigurable input matching and reconfigurable output matching, and the reconfigurable structures each may implement switching at 1.75 GHz and 2.6 GHz.

The reconfigurable output matching network may implement band switching by adding the reconfigurable structure composed of the PIN switch and the reconfigurable microstrip, and may include a PIN switch 1, a PIN switch 2, a first microstrip TL1, a second microstrip TL2, a third microstrip TL3, a fourth microstrip TL4, a fifth microstrip TL5, a sixth microstrip TL6 and a seventh microstrip TL7, where the TL1, the TL2, the TL3 and the TL4 each may be a series microstrip, while the TL5, the TL6 and the TL7 each may be a parallel microstrip; the drain of the transistor may be connected to the first microstrip TL1, the other end of the first microstrip TL1 may be connected to one end of the second microstrip TL2 and one end of the fifth microstrip TL5, one end of the second microstrip TL2 may be connected to one end of the third microstrip TL3 and one end of the PIN switch 1, the other end of the PIN switch 1 may be connected to the sixth microstrip TL6, the other end of the third microstrip TL3 may be connected to one end of the fourth microstrip TL4 and one end of the PIN switch 2, and the other end of the PIN switch 2 may be connected to the seventh microstrip TL7; when the PIN switch 1 is closed, and the PIN switch 2 is open, the first microstrip TL1, the second microstrip TL2, the third microstrip TL3, the fourth microstrip TL4, the fifth microstrip TL5 and the sixth microstrip TL6 may be jointly formed into a matching circuit, but the seventh microstrip TL7 may be unavailable for matching, thereby implementing output matching at 1.75 GHz; and when the PIN switch 1 is open, and the PIN switch 2 is closed, the first microstrip TL1, the second microstrip TL2, the third microstrip TL3, the fourth microstrip TL4, the fifth microstrip TL5 and the seventh microstrip TL7 may be jointly formed into a matching circuit, but the sixth microstrip TL6 may be unavailable for matching, thereby implementing output matching at 2.6 GHz.

The reconfigurable input matching circuit may be structurally identical to the reconfigurable output matching circuit; and while the drain bias circuit supplies power to the transistor, a loss on a band where the reconfigurable PA works may be minimum, and the drain bias circuit may include an eighth microstrip TL8, a ninth microstrip TL9, a tenth microstrip TL10 and a blocking capacitor C1, where one end of the eighth microstrip TL8 may be connected to the drain of the transistor, the other end of the eighth microstrip TL8 may be connected to the ninth microstrip TL9 and the tenth microstrip TL10, the ninth microstrip TL9 may be a parallel open-circuited microstrip, and the other end of the tenth microstrip TL10 may be connected to a drain power supply.

The gate bias circuit may be structurally identical to the drain bias circuit.

The present disclosure further provides a design method of a reconfigurable PA based on a PIN switch, including the following steps:

step S1: repeatedly performing load pull and source pull on a gallium nitride (GaN) high electron mobility transistor (HEMT) CGH40010F transistor to obtain an optimum load impedance and an optimum source impedance of the transistor at a power-added efficiency (PAE) and a maximum output power;

step S2: designing a gate bias network and a drain bias network based on a concept of implementing impedance transformation with a quarter-wave microstrip, to ensure a stable direct-current (DC) power voltage of the PA, where three microstrips TL8, TL9, TL10 and a short-circuited capacitor C1 are used, the microstrips TL8 and TL10 each are a series microstrip, and the microstrip TL9 is a parallel microstrip;

step S3: designing a reconfigurable output matching circuit, optimizing a reconfigurable output matching structure through loci along a Smith chart after optimum load impedances at different frequencies pass through microstrips, and searching suitable electrical length and characteristic impedance of each of the microstrips, where the reconfigurable output matching circuit includes a PIN switch 1, a PIN switch 2, a first microstrip TL1, a second microstrip TL2, a third microstrip TL3, a fourth microstrip TL4, a fifth microstrip TL5, a sixth microstrip TL6 and a seventh microstrip TL7, where the TL1, the TL2, the TL3 and the TL4 each are a series microstrip, while the TL5, the TL6 and the TL7 each are a parallel microstrip; the drain of the transistor is connected to one end of the first microstrip TL1, the other end of the first microstrip TL1 is connected to one end of the second microstrip TL2 and one end of the fifth microstrip TL5, the other end of the second microstrip TL2 is connected to one end of the third microstrip TL3 and one end of the PIN switch 1, the other end of the PIN switch 1 is connected to the sixth microstrip TL6, the other end of the third microstrip TL3 is connected to one end of the fourth microstrip TL4 and one end of the PIN switch 2, and the other end of the PIN switch 2 is connected to the seventh microstrip TL7; when the PIN switch 1 is closed, and the PIN switch 2 is open, the first microstrip TL1, the second microstrip TL2, the third microstrip TL3, the fourth microstrip TL4, the fifth microstrip TL5 and the sixth microstrip TL6 are jointly formed into a matching circuit, but the seventh microstrip TL7 is unavailable for matching; and when the PIN switch 1 is open, and the PIN switch 2 is closed, the first microstrip TL1, the second microstrip TL2, the third microstrip TL3, the fourth microstrip TL4, the fifth microstrip TL5 and the seventh microstrip TL7 are jointly formed into a matching circuit, but the sixth microstrip TL6 is unavailable for matching;

step S4: designing a reconfigurable structure, where the reconfigurable structure is composed of a PIN switch and a reconfigurable stub, the output matching network is reconfigured by changing an on-off state of the PIN switch in the reconfigurable structure, and since an electrical length and a characteristic impedance of each of the microstrips TL1, TL2, TL3, TL4, TL5 are determined, continuously adjusting a characteristic impedance and an electrical length of the microstrip TL6 at 1.75 GHz makes an output impedance at a point G to be right 50Ω; and likewise, continuously adjusting a characteristic impedance and an electrical length of the microstrip TL7 at 2.6 GHz makes the output impedance at the point G to be right 50 Ω;

step S5: designing a reconfigurable input matching network in a method same as that of the output matching circuit, to make the reconfigurable PA perform better; and step S6: constructing an overall circuit structure in combination with steps S1, S2, S3, S4, S5, and performing circuit simulation and optimization with advanced design system (ADS) software, thereby implementing optimal performance.

As a further improvement, the drain bias circuit may include an eighth microstrip TL8, a ninth microstrip TL9, a tenth microstrip TL10 and a blocking capacitor C1, where one end of the eighth microstrip TL8 may be connected to the drain of the transistor, the other end of the eighth microstrip TL8 may be connected to the ninth microstrip TL9 and the tenth microstrip TL10, the ninth microstrip TL9 may be a parallel open-circuited microstrip, and the other end of the tenth microstrip TL10 may be connected to a drain power supply.

Compared with the conventional dual-band PAs in the prior art, the reconfigurable PA based on a PIN switch provided by the present disclosure mainly implements a reconfigurable function of the matching circuit by changing the on-off state of the PIN switch in the matching circuit, and employs different matching circuits at different frequencies to obtain the desirable matching at each frequency. In view that the conventional dual-band PAs are either structured simply with a lower efficiency or structured complicatedly with a higher efficiency, the reconfigurable PA based on a PIN switch provided by the present disclosure solves the contradiction well, and improves the efficiency of the PA; and meanwhile, the present disclosure optimizes the bias circuit in a certain degree, further improving the overall performance of the PA.

DETAILED DESCRIPTION OF THE EMBODIMENTS

To make the objectives, technical solutions and advantages of the present disclosure clearer and more comprehensible, specific implementations of the present disclosure will be further described below in detail in conjunction with the embodiments and accompanying drawings.

Existing reconfigurable PAs mainly present the following defects in design, namely reconfigurable devices are designed hardly and undesirably with certain influences on the circuits, matching circuits of the reconfigurable PAs are structured simply and implemented hardly, and the PAs are also obstructed by difficult debugging because influences from changes of matching circuit structures on overall performance cannot be observed simultaneously during debugging.

In view of the above problems, an objective of the present disclosure is to provide a reconfigurable PA based on a PIN switch and a design method thereof. The present disclosure changes the structure of the output matching circuit network by changing a working state of the PIN switch in the output matching circuit, thereby implementing the reconfigurable function, and achieving desirable working performance of the PA at different modes and bands; and in order to further improve the performance of the reconfigurable PA, the present disclosure uses the same method to design the input matching circuit.

Figure 1:
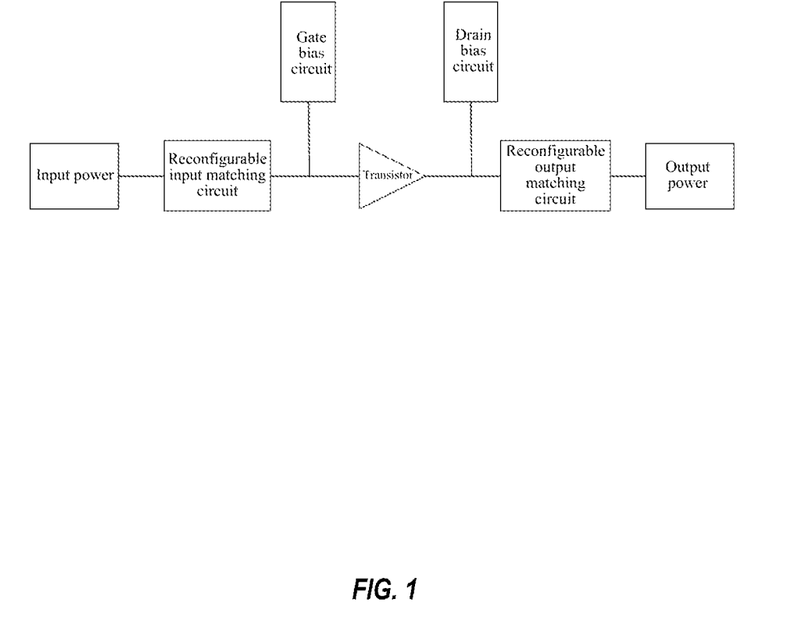
FIG. 1 illustrates a schematic structural view of a reconfigurable PA based on a PIN switch according to the present disclosure.

FIG. 1 illustrates a schematic structural view of a reconfigurable PA based on a PIN switch according to the present disclosure. The reconfigurable PA based on a PIN switch includes a reconfigurable input matching network, a gate bias network, a transistor, a drain bias network and a reconfigurable output matching network, where the reconfigurable input matching network includes an input end adapted and connected to an input port, and an output end connected to a gate of the transistor, and the gate bias circuit is connected in parallel with the gate of the transistor;

a drain of the transistor is connected in parallel with the drain bias circuit, and connected to an input end of the reconfigurable output matching network;

the reconfigurable input matching circuit includes a trunk microstrip and reconfigurable structures;

the trunk microstrip is respectively connected to the input port, the transistor and the bias circuits, and the trunk microstrip is connected to a plurality of reconfigurable structures;

the reconfigurable structures each are composed of a PIN switch and a microstrip by connecting in series; and an output port is adapted and connected to the reconfigurable output matching circuit.

Figure 2:
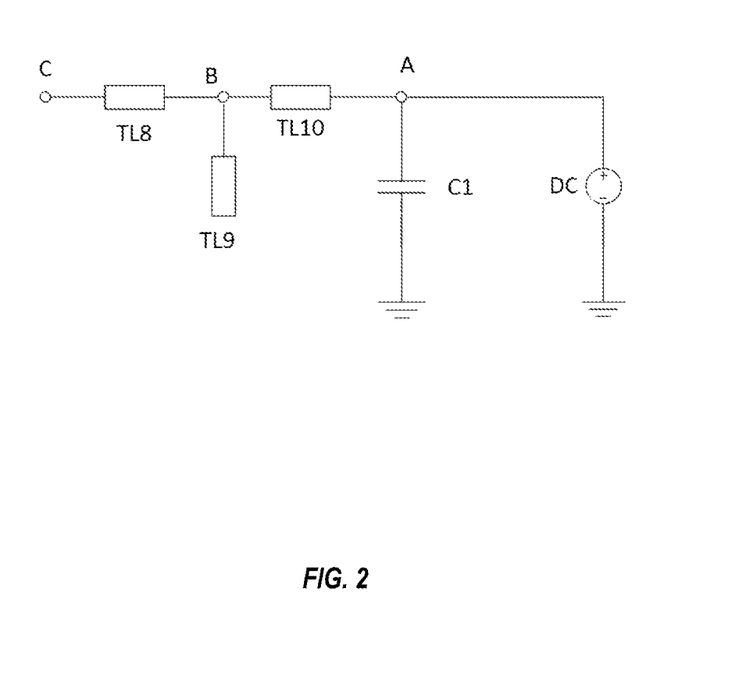
FIG. 2 illustrates a schematic view of a network topology of a bias circuit according to the present disclosure.

FIG. 2 illustrates a network topology of a drain bias circuit. While the drain bias circuit supplies power to the transistor, a loss on a band where the reconfigurable PA works is minimum, and the drain bias circuit includes an eighth microstrip TL8, a ninth microstrip TL9, a tenth microstrip TL10 and a blocking capacitor C1, where one end of the eighth microstrip TL8 is connected to the drain of the transistor, the other end of the eighth microstrip TL8 is connected to the ninth microstrip TL9 and the tenth microstrip TL10, the ninth microstrip TL9 is a parallel open-circuited microstrip, and the other end of the tenth microstrip TL10 is connected to a drain power supply.

The gate bias circuit is structurally identical to the drain bias circuit.

Further, the descriptions are made to parameter calculation of the microstrips of the drain bias circuit:

The microstrips each involve two specific parameters, namely the characteristic impedance $Z_n$ and an electrical length $\theta_n$ where the characteristic impedance $Z_n$ is the free parameter, and the electrical length $\theta_n$ is the parameter to be sought. For ease of description, when the working band has the working frequency points of $f_1$ and $f_2$, corresponding electrical lengths and characteristic impedances are $\theta_1$ and $\theta_2$, $Z_1$ and $Z_2$, $n=f_2/f_1$.

The network topology of the drain bias circuit includes series microstrips TL8 and TL10, a parallel microstrip TL10 and a short-circuited capacitor C1. As the TL8 and the TL9 each have an electrical length of 90°, a characteristic impedance of 50Ω, and a frequency of 2.6 GHz, the point B at 2.6 GHz has an impedance of 0Ω; and through the TL8 having the electrical length of 90°, the impedance of the point C at 2.6 GHz is infinitely great. With no RF signal passing through the bias circuit, the DC power supply is damaged. However, the RF open circuit hasn't been implemented at 1.75 GHz, and in this case, the electrical length of the TL10 needs to be calculated. As the point A is grounded through the short-circuited capacitor C1, the point A has an impedance of 0Ω.

The impedance from the point A to the point B is given by $$Z_{B1}(f_1) = Z_{10} * \frac{Z_A + jZ_{10} * \tan(\theta_{10})}{Z_{10} + jZ_A * \tan(\theta_{10})} \quad (1)$$

The impedance from the ninth microstrip TL9 to the point B is given by $$Z_{B2}(f_1) = Z_9 * \frac{Z_L + jZ_9 * \tan(\theta_9/n)}{Z_9 + jZ_L * \tan(\theta_9/n)} \quad (2)$$

The impedance of the point B at $f_1$ is given by $$Z_B = \frac{Z_{B1} * Z_{B2}}{Z_{B1} + Z_{B2}} \quad (3)$$

The impedance from the point B to the point C is given by $$Z_C(f_1) = Z_8 * \frac{Z_B + jZ_8 * \tan(\theta_8/n)}{Z_8 + jZ_B * \tan(\theta_8/n)} \quad (4)$$

To implement the RF open circuit, the impedance $Z_c$ of the point C at 1.75 GHz must be infinitely great. With the known $Z_A$, the known characteristic impedance and electrical length of each of the eighth microstrip TL8 and the ninth microstrip TL9, and the known characteristic impedance of the tenth microstrip TL10, the electrical length of the tenth microstrip TL10 can be calculated with the above equation.

Figure 3A:
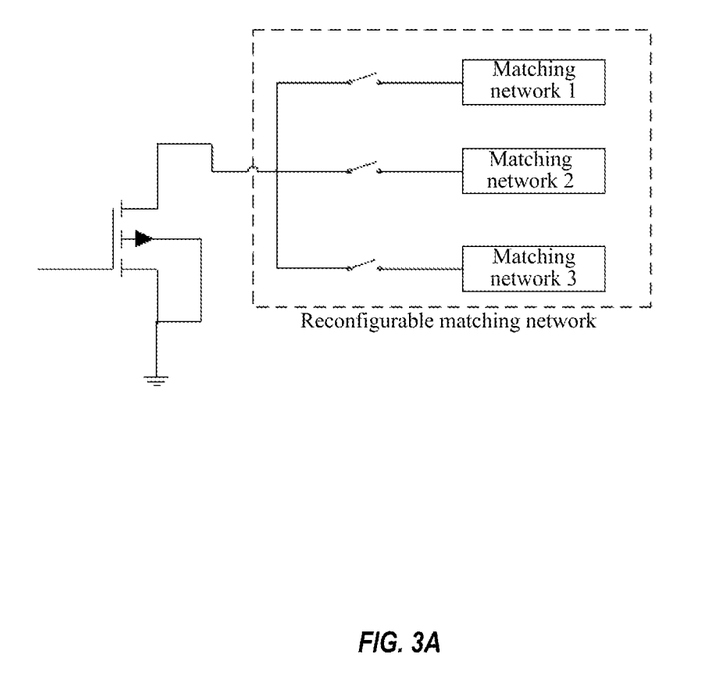
FIG. 3a illustrates a schematic structural view of a conventional reconfigurable matching circuit.

FIG. 3a illustrates a network topology of a matching structure of a conventional reconfigurable matching circuit. Matching networks for required bands are sequentially designed, and integrated together through PIN switches, thereby forming the reconfigurable matching circuits. The matching circuits are approximately independent of each other and are not affected to each other; and the matching networks are selected by the switches to implement normal work at different modes and different frequencies. Compared with other reconfigurable matching structures, the reconfigurable matching structure herein is designed simply. Nevertheless, its disadvantages are also obvious, namely, frequency points that can be integrated in the same PA are very limited; and with the increase in the working frequency points of the PA, the corresponding matching networks are also added and the number of required switches is also rising gradually, which will enlarge the size of the PA with a higher cost.

Figure 3B:
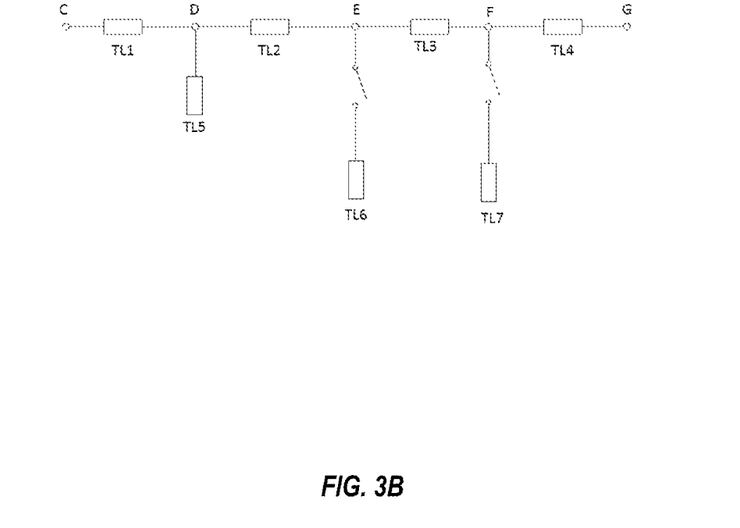
FIG. 3b illustrates a schematic structural view of an optimized reconfigurable matching circuit.

FIG. 3b illustrates a schematic topological view of an optimized reconfigurable output matching network. The reconfigurable output matching network implements band switching by adding the reconfigurable structure composed of the PIN switch and the reconfigurable microstrip, and includes a PIN switch 1, a PIN switch 2, a first microstrip TL1, a second microstrip TL2, a third microstrip TL3, a fourth microstrip TL4, a fifth microstrip TL5, a sixth microstrip TL6 and a seventh microstrip TL7, where the TL1, the TL2, the TL3 and the TL4 each are a series microstrip, while the TL5, the TL6 and the TL7 each are a parallel microstrip; the drain of the transistor is connected to the first microstrip TL1, the other end of the first microstrip TL1 is connected to one end of the second microstrip TL2 and one end of the fifth microstrip TL5, one end of the second microstrip TL2 is connected to one end of the third microstrip TL3 and one end of the PIN switch 1, the other end of the PIN switch 1 is connected to the sixth microstrip TL6, the other end of the third microstrip TL3 is connected to one end of the fourth microstrip TL4 and one end of the PIN switch 2, and the other end of the PIN switch 2 is connected to the seventh microstrip TL7; when the PIN switch 1 is closed, and the PIN switch 2 is open, the first microstrip TL1, the second microstrip TL2, the third microstrip TL3, the fourth microstrip TL4, the fifth microstrip TL5 and the sixth microstrip TL6 are jointly formed into a matching circuit, but the seventh microstrip TL7 is unavailable for matching, thereby implementing output matching at 1.75 GHz; and when the PIN switch 1 is open, and the PIN switch 2 is closed, the first microstrip TL1, the second microstrip TL2, the third microstrip TL3, the fourth microstrip TL4, the fifth microstrip TL5 and the seventh microstrip TL7 are jointly formed into a matching circuit, but the sixth microstrip TL6 is unavailable for matching, thereby implementing output matching at 2.6 GHz. The optimized reconfigurable output matching structure has the smaller circuit size, better debugging, less loss and simpler structure over the conventional reconfigurable matching structure.

Further, the descriptions are further made to the working principle of the reconfigurable matching network:

The specific parameters of the microstrips are the electrical length $\theta_n$ and the characteristic impedance $Z_n$. In order to determine specific parameters of each microstrip, load pull is used to obtain optimum fundamental impedances at central frequencies $f_1$ and $f_2$, specifically, the optimum fundamental impedances $Z_{f1}$ and $Z_{f2}$ at the central frequencies 1.75 GHz and 2.6 GHz.

The impedance from the point C to the point D through the first microstrip TL1 is given by $$Z_{D1}(f_1) = Z_1 * \frac{Z_{C1} + jZ_1 * \tan(\theta_1)}{Z_1 + jZ_{C1} * \tan(\theta_1)} \tag{5}$$

$$Z_{D1}(f_2) = Z_1 * \frac{Z_{C2} + jZ_1 * \tan(n*\theta_1)}{Z_1 + jZ_{C2} * \tan(n*\theta_1)} \tag{6}$$

The impedance from the open-circuited point to the point D through the fifth microstrip TL5 is given by $$Z_{D2}(f_1) = \frac{-jZ_5}{\tan(\theta_5)} \tag{7}$$

$$Z_{D2}(f_2) = \frac{-jZ_5}{\tan(n*\theta_5)} \tag{8}$$

Therefore, the total impedance of the point D is $$Z_D(f_1) = \frac{Z_{D1}(f_1)*Z_{D2}(f_1)}{Z_{D1}(f_1)+Z_{D2}(f_1)} \tag{9}$$

$$Z_D(f_2) = \frac{Z_{D1}(f_2)*Z_{D2}(f_2)}{Z_{D1}(f_2)+Z_{D2}(f_2)} \tag{10}$$

The impedance from the point D to the point E through the second microstrip TL2 is given by $$Z_{E1}(f_1) = Z_2 * \frac{Z_D(f_1) + jZ_2 * \tan(\theta_2)}{Z_2 + jZ_D(f_1) * \tan(\theta_2)} \tag{11}$$

$$Z_{E1}(f_2) = Z_2 * \frac{Z_D(f_2) + jZ_2 * \tan(n*\theta_2)}{Z_2 + jZ_D(f_2) * \tan(n*\theta_2)} \tag{12}$$

The impedance from the open-circuited point to the point E through the sixth microstrip TL6 is given by $$Z_{E2}(f_1) = \frac{-jZ_6}{\tan(\theta_6)} \tag{13}$$

Therefore, the total impedance of the point E at the $f_1$, is $$Z_E(f_1) = \frac{Z_{E1}(f_1)*Z_{E2}(f_1)}{Z_{E1}(f_1)+Z_{E2}(f_1)} \tag{14}$$

Moreover, as the sixth microstrip TL6 is unavailable for matching at the $f_2$, the impedance of the point E at the $f_2$ is given by $$Z_E(f_2) = Z_{E1}(f_2) \tag{15}$$

The impedance from the point E to the point F through the third microstrip TL3 is given by $$Z_F(f_1) = Z_3 * \frac{Z_E(f_1) + jZ_3 * \tan(\theta_3)}{Z_3 + jZ_E(f_1) * \tan(\theta_3)} \quad (16)$$

$$Z_{F1}(f_2) = Z_3 * \frac{Z_E(f_2) + jZ_3 * \tan(n * \theta_3)}{Z_3 + jZ_E(f_2) * \tan(n * \theta_3)} \quad (17)$$

The impedance from the open-circuited point to the point E through the seventh microstrip TL7 is given by $$Z_{F2}(f_2) = \frac{-jZ_7}{\tan(n * \theta_7)} \quad (18)$$

Moreover, as the seventh microstrip TL7 is unavailable for matching at the $f_1$, the impedance of the point F at the $f_1$ is given by $$Z_F(f_1) = Z_{F1}(f_1) \quad (19)$$

Therefore, the total impedance of the point F at the $f_2$ is $$Z_F(f_2) = \frac{Z_{F1}(f_2) * Z_{F2}(f_2)}{Z_{F1}(f_2) + Z_{F2}(f_2)} \quad (20)$$

The impedance from the point F to the point G through the fourth microstrip TL4 is given by $$Z_G(f_1) = Z_4 * \frac{Z_F(f_1) + jZ_4 * \tan(\theta_4)}{Z_4 + jZ_F(f_1) * \tan(\theta_4)} \quad (21)$$

$$Z_{F1}(f_2) = Z_4 * \frac{Z_F(f_2) + jZ_4 * \tan(n * \theta_4)}{Z_4 + jZ_F(f_2) * \tan(n * \theta_4)} \quad (22)$$

Through the reconfigurable output matching network, the actual impedance $Z_{in_{opt}}$ is used as the designed output impedance. However, as the switches are not ideal devices and will affect to each other, the impedance is to be tuned depending on the power and the efficiency.

If the point G has an impedance of 50Ω at two frequencies, it is indicated that the transistor and the load are well matched.

The present disclosure provides a design method of a reconfigurable PA based on a PIN switch, including the following steps:

Step S1: Repeatedly perform load pull and source pull on a GaN HEMT CGH40010F transistor to obtain an optimum load impedance and an optimum source impedance of the transistor at a PAE and a maximum output power.

Step 2: Design a gate bias network and a drain bias network based on a concept of implementing impedance transformation with a quarter-wave microstrip, to ensure a stable DC power voltage of the PA. However, since a single quarter-wave microstrip cannot implement the RF open circuit on two bands, the bias circuit is optimized with three microstrips TL8, TL9, TL10 and a short-circuited capacitor C1, where the microstrips TL8 and TL10 each are a series microstrip, the microstrip TL9 is a parallel microstrip, and the microstrips TL8, TL9, TL10 have the electrical length and the characteristic impedance of $\theta_8$, $\theta_9$, $\theta_{10}$ and $Z_8$, $Z_9$, $Z_{10}$, respectively. In order to implement the RF open circuit at 1.75 GHz and 2.6 GHz, and prevent the RF signal from damaging the current source, the above Equations (1) (2) (3) need to be met at the same time to be equivalent to the quarter-wave line. The transmission matrix of the quarter-wave line is $$\begin{bmatrix} A & B \\ C & D \end{bmatrix} = \begin{bmatrix} 0 & \pm jZ_T \\ \pm\frac{j}{Z_T} & 0 \end{bmatrix} =$$

$$\begin{bmatrix} \cos\theta_8 & jZ_8\sin\theta_8 \\ j\frac{1}{Z_8\sin\theta_8} & \cos\theta_8 \end{bmatrix} * \begin{bmatrix} 1 & jZ_9\tan\theta_9 \\ 0 & 1 \end{bmatrix} * \begin{bmatrix} \cos\theta_{10} & jZ_{10}\sin\theta_{10} \\ j\frac{1}{Z_{10}\sin\theta_{10}} & \cos\theta_{10} \end{bmatrix}$$

(23)

The characteristic parameters of the microstrips are obtained by calculation.

Step S3: Design a reconfigurable output matching circuit, observe loci along a Smith chart after optimum load impedances at different frequencies pass through microstrips, and search suitable electrical length and characteristic impedance of each of the microstrips with an optimized reconfigurable output matching structure. In response to the central frequency $f_1$, the output matching network is equivalently composed of the series microstrips TL1, TL2, TL3, TL4 and the parallel microstrips TL5, TL6; and in response to the central frequency $f_2$, the output matching network is equivalently composed of the series microstrips TL1, TL2, TL3, TL4 and the parallel microstrips TL5, TL7. The electrical length and the characteristic impedance of the microstrip TL1 are $\theta_1$ and $Z_1$, and the impedance of the point D through the microstrip TL1 is given by $$Z_{D1}(f_1) = Z_1 * \frac{Z_{C1} + jZ_1 * \tan(\theta_1)}{Z_1 + jZ_{C1} * \tan(\theta_1)} \quad (24)$$

$$Z_{D1}(f_2) = Z_1 * \frac{Z_{C2} + jZ_1 * \tan(n * \theta_1)}{Z_1 + jZ_{C2} * \tan(n * \theta_1)} \quad (25)$$

The results are substituted into the Equations (7)-(22). Due to the heavy calculation burden, the characteristic parameter and electrical length of each microstrip are calculated with matlab, and the final impedance at the point G is near the standard 50Ω.

Step S4: Design a reconfigurable structure, where the reconfigurable structure is composed of a PIN switch and a reconfigurable stub, the output matching network is reconfigured by changing an on-off state of the PIN switch in the reconfigurable structure, and since electrical lengths θ and characteristic impedances Z of the reconfigurable microstrips are determined upon determination of a trunk line of the matching circuit, namely an electrical length and a characteristic impedance of each of the microstrips TL1, TL2, TL3, TL4, TL5 are determined, continuously adjusting a characteristic impedance and an electrical length of the microstrip TL6 at 1.75 GHz makes an output impedance at a point G to be right 50Ω; and likewise, continuously adjusting a characteristic impedance and an electrical length of the microstrip TL7 at 2.6 GHz makes the output impedance at the point G to be right 50Ω;

Step S5: Design a reconfigurable input matching network in a method same as that of the output matching circuit, to make the reconfigurable PA perform better.

Step S6: Construct an overall circuit structure in combination with Steps S1, S2, S3, S4, S5, and perform circuit simulation and optimization with ADS software, thereby implementing optimal performance.

Figure 4A:
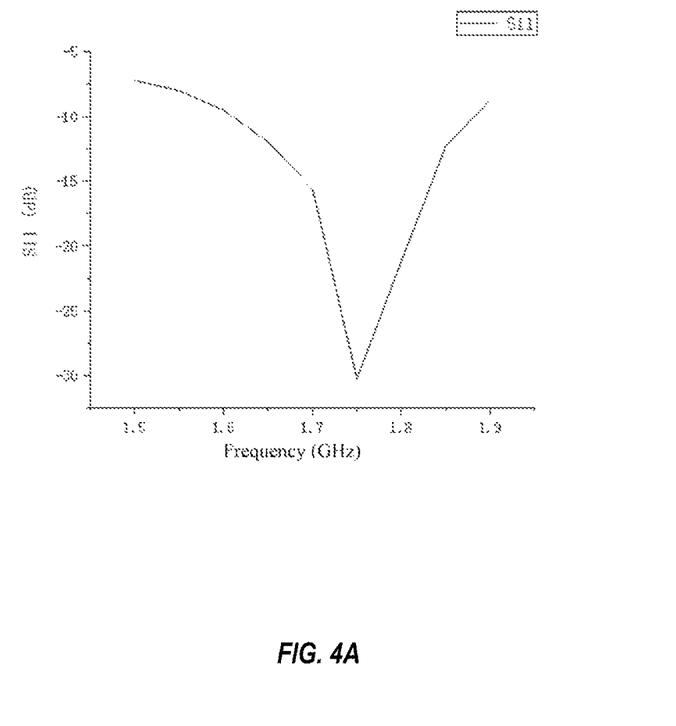
FIG. 4a illustrates a schematic view of a simulation result of an S parameter of a reconfigurable matching circuit at $f_1$ according to the present disclosure.
Figure 4B:
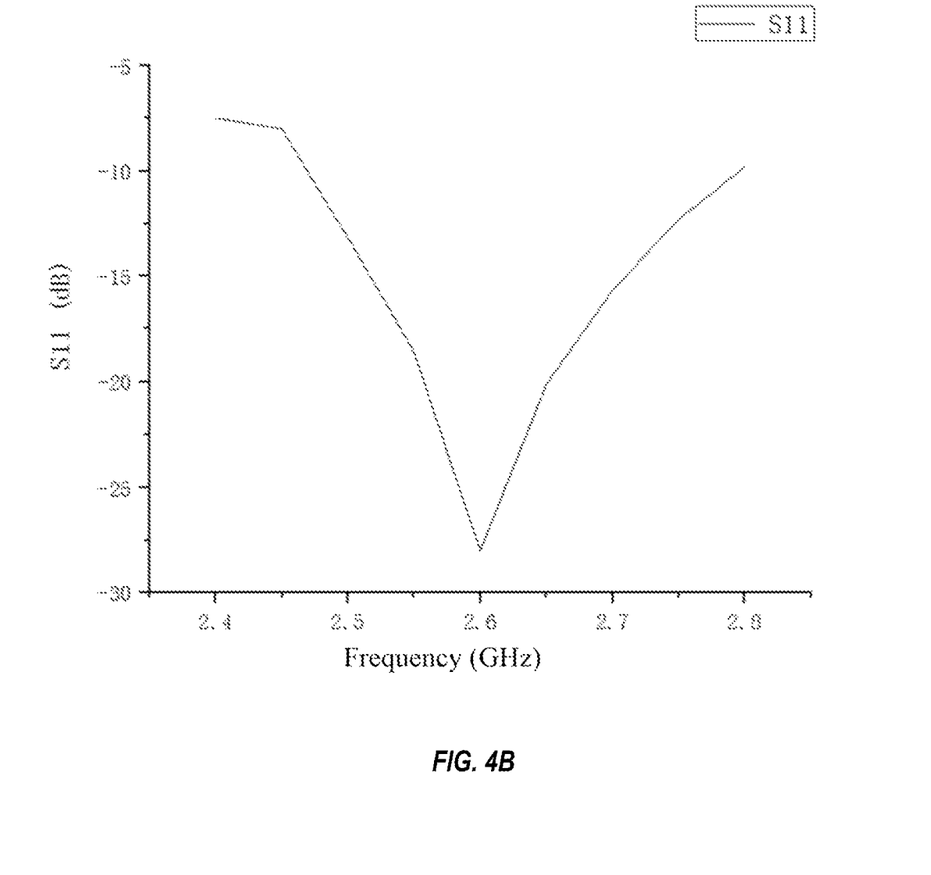
FIG. 4b illustrates a schematic view of a simulation result of an S parameter of a reconfigurable matching circuit at $f_2$ according to the present disclosure.
Figure 5A:
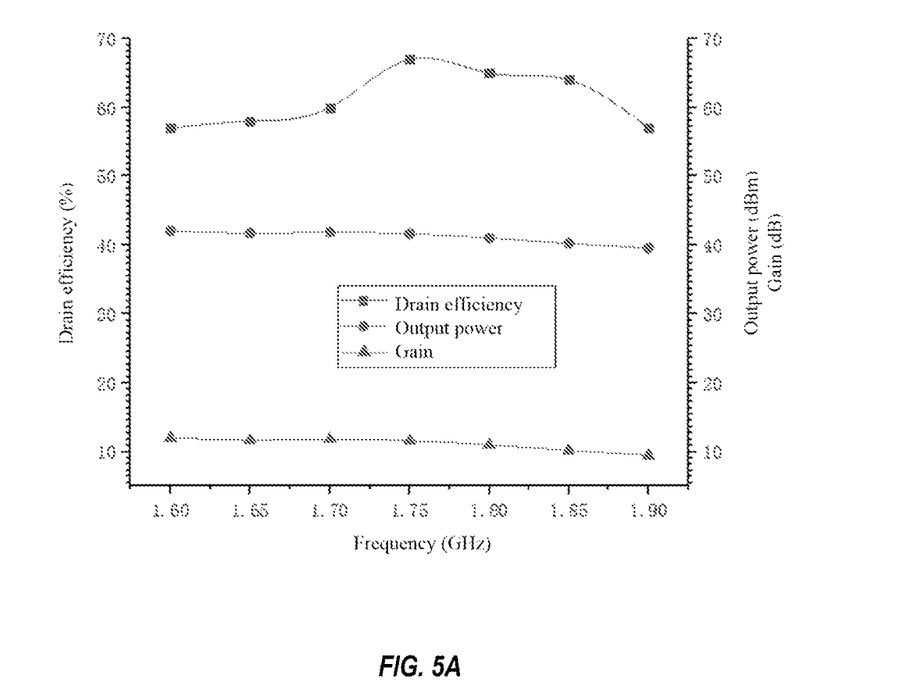
FIG. 5a illustrates a schematic view of a simulation result for an output power, an efficiency and a gain of a reconfigurable PA based on a PIN switch at $f_1$ according to the present disclosure.
Figure 5B:
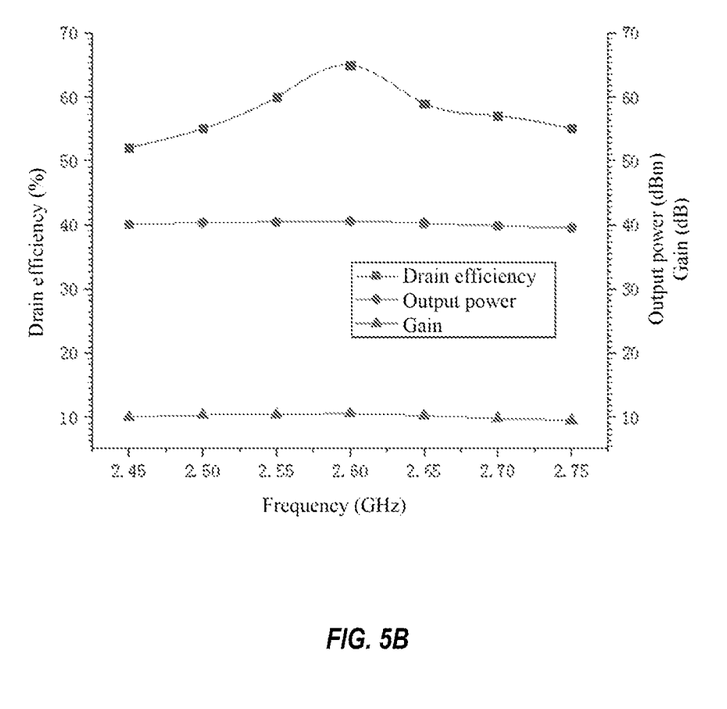
FIG. 5b illustrates a schematic view of a simulation result for an output power, an efficiency and a gain of a reconfigurable PA based on a PIN switch at $f_1$ according to the present disclosure.

The technical effects of the present disclosure are further described below in conjunction with simulation experiments. FIG. 4a illustrates a schematic view of a simulation result of an S parameter of a reconfigurable matching circuit at $f_1$ according to the present disclosure; FIG. 4b illustrates a schematic view of a simulation result of an S parameter of a reconfigurable matching circuit at $f_2$ according to the present disclosure; FIG. 5a illustrates a schematic view of a simulation result for an output power, an efficiency and a gain of a reconfigurable PA based on a PIN switch at $f_1$ according to the present disclosure; and FIG. 5b illustrates a schematic view of a simulation result for an output power, an efficiency and a gain of a reconfigurable PA based on a PIN switch at $f_1$ according to the present disclosure. As can be seen from the simulation results, when the central frequency is 1.75 GHz, the saturated output power is 41.63 dBm, the gain is 11.63 dB, and the drain efficiency is 69%; when the central frequency is 2.6 GHz, the saturated output power is 40.48 dBm, the gain is 10.48 dB, and the drain efficiency is 65%; and compared with other dual-band PAs which have the drain efficiency of about 60% and the output power of about 40 dBm, the present disclosure obviously improves the performance and achieves the expected effects.

The above description of examples is merely provided to help illustrate the method of the present disclosure and a core idea thereof. It should be noted that several improvements and modifications may be made by persons of ordinary skill in the art without departing from the principle of the present disclosure, and these improvements and modifications should also fall within the protection scope of the present disclosure. Various amendments to these embodiments are apparent to those of professional skill in the art, and the general principles defined herein may be implemented in other embodiments without departing from the spirit or scope of the present disclosure. Thus, the present disclosure is not limited to the embodiments shown herein but falls within the widest scope consistent with the principles and novel features disclosed herein.

What is claimed is:

1. A reconfigurable power amplifier (PA) based on a PIN switch, at least comprising an input port, a reconfigurable input matching circuit, a gate bias circuit, a transistor, a reconfigurable output matching circuit, a drain bias circuit and an output port, wherein
the reconfigurable input matching network comprises an input end adapted and connected to the input port, and an output end connected to a gate of the transistor, and the gate bias circuit is connected in parallel with the gate of the transistor;
a drain of the transistor is connected in parallel with the drain bias circuit, and connected to an input end of the output matching network;
the reconfigurable input matching circuit comprises a trunk microstrip and reconfigurable structures, and the trunk microstrip is connected to the input port, the transistor and the bias circuits; the trunk microstrip is connected to a plurality of reconfigurable structures; and the reconfigurable structures each are composed of a PIN switch and a microstrip by connecting in series;
the output port is adapted and connected to the output matching circuit;
the reconfigurable output matching circuit comprises a PIN switch 1, a PIN switch 2, a first microstrip TL1, a second microstrip TL2, a third microstrip TL3, a fourth microstrip TL4, a fifth microstrip TL5, a sixth microstrip TL6 and a seventh microstrip TL7, wherein the TL1, the TL2, the TL3 and the TL4 each are a series microstrip, while the TL5, the TL6 and the TL7 each are a parallel microstrip; the drain of the transistor is connected to one end of the first microstrip TL1, the other end of the first microstrip TL1 is connected to one end of the second microstrip TL2 and one end of the fifth microstrip TL5, the other end of the second microstrip TL2 is connected to one end of the third microstrip TL3 and one end of the PIN switch 1, the other end of the PIN switch 1 is connected to the sixth microstrip TL6, the other end of the third microstrip TL3 is connected to one end of the fourth microstrip TL4 and one end of the PIN switch 2, and the other end of the PIN switch 2 is connected to the seventh microstrip TL7; when the PIN switch 1 is closed, and the PIN switch 2 is open, the first microstrip TL1, the second microstrip TL2, the third microstrip TL3, the fourth microstrip TL4, the fifth microstrip TL5 and the sixth microstrip TL6 are jointly formed into a matching circuit, but the seventh microstrip TL7 is unavailable for matching; and when the PIN switch 1 is open, and the PIN switch 2 is closed, the first microstrip TL1, the second microstrip TL2, the third microstrip TL3, the fourth microstrip TL4, the fifth microstrip TL5 and the seventh microstrip TL7 are jointly formed into a matching circuit, but the sixth microstrip TL6 is unavailable for matching; and
the drain bias circuit comprises an eighth microstrip TL8, a ninth microstrip TL9, a tenth microstrip TL10 and a blocking capacitor C1, wherein one end of the eighth microstrip TL8 is connected to the drain of the transistor, the other end of the eighth microstrip TL8 is connected to the ninth microstrip TL9 and the tenth microstrip TL10, the ninth microstrip TL9 is a parallel open-circuited microstrip, and the other end of the tenth microstrip TL10 is connected to a drain power supply.

2. The reconfigurable PA based on a PIN switch according to claim 1, wherein the reconfigurable output matching circuit comprises a reconfigurable structure.

3. The reconfigurable PA based on a PIN switch according to claim 1, wherein the reconfigurable structures each are combined and switched to implement band switching at 1.75 GHz and 2.6 GHz.

4. The reconfigurable PA based on a PIN switch according to claim 1, wherein the gate bias circuit is structurally identical to the drain bias circuit.

5. A design method of a reconfigurable power amplifier (PA) based on a PIN switch, comprising the following steps:
step S1: repeatedly performing load pull and source pull on a gallium nitride (GaN) high electron mobility transistor (HEMT) CGH40010F transistor to obtain an optimum load impedance and an optimum source impedance of the transistor at a power-added efficiency (PAE) and a maximum output power;
step 2: designing a gate bias network and a drain bias network based on a concept of implementing impedance transformation with a quarter-wave microstrip, to ensure a stable direct-current (DC) power voltage of the PA, wherein three microstrips TL8, TL9, TL10 and a short-circuited capacitor C1 are used, the microstrips TL8 and TL10 each are a series microstrip, and the microstrip TL9 is a parallel microstrip;
step S3: designing a reconfigurable output matching circuit, optimizing a reconfigurable output matching structure through loci along a Smith chart after optimum load impedances at different frequencies pass through microstrips, and searching suitable electrical length and characteristic impedance of each of the microstrips, wherein
the reconfigurable output matching circuit comprises a PIN switch 1, a PIN switch 2, a first microstrip TL1, a second microstrip TL2, a third microstrip TL3, a fourth microstrip TL4, a fifth microstrip TL5, a sixth microstrip TL6 and a seventh microstrip TL7, wherein the TL1, the TL2, the TL3 and the TL4 each are a series microstrip, while the TL5, the TL6 and the TL7 each are a parallel microstrip; the drain of the transistor is connected to one end of the first microstrip TL1, the other end of the first microstrip TL1 is connected to one end of the second microstrip TL2 and one end of the fifth microstrip TL5, the other end of the second microstrip TL2 is connected to one end of the third microstrip TL3 and one end of the PIN switch 1, the other end of the PIN switch 1 is connected to the sixth microstrip TL6, the other end of the third microstrip TL3 is connected to one end of the fourth microstrip TL4 and one end of the PIN switch 2, and the other end of the PIN switch 2 is connected to the seventh microstrip TL7; when the PIN switch 1 is closed, and the PIN switch 2 is open, the first microstrip TL1, the second microstrip TL2, the third microstrip TL3, the fourth microstrip TL4, the fifth microstrip TL5 and the sixth microstrip TL6 are jointly formed into a matching circuit, but the seventh microstrip TL7 is unavailable for matching; and when the PIN switch 1 is open, and the PIN switch 2 is closed, the first microstrip TL1, the second microstrip TL2, the third microstrip TL3, the fourth microstrip TL4, the fifth microstrip TL5 and the seventh microstrip TL7 are jointly formed into a matching circuit, but the sixth microstrip TL6 is unavailable for matching;

step S4: designing a reconfigurable structure, wherein the reconfigurable structure is composed of a PIN switch and a reconfigurable stub, the output matching network is reconfigured by changing an on-off state of the PIN switch in the reconfigurable structure, and since an electrical length and a characteristic impedance of each of the microstrips TL1, TL2, TL3, TL4, TL5 are determined, continuously adjusting a characteristic impedance and an electrical length of the microstrip TL6 at 1.75 GHz makes an output impedance at a point G to be right 50Ω; and likewise, continuously adjusting a characteristic impedance and an electrical length of the microstrip TL7 at 2.6 GHz makes the output impedance at the point G to be right 50 Ω;

step S5: designing a reconfigurable input matching network in a method same as that of the output matching circuit, to make the reconfigurable PA perform better; and step S6: constructing an overall circuit structure in combination with steps S1, S2, S3, S4, S5, and performing circuit simulation and optimization with advanced design system (ADS) software, thereby implementing optimal performance.

6. The design method of a reconfigurable PA based on a PIN switch according to claim 1, wherein the drain bias circuit comprises an eighth microstrip TL8, a ninth microstrip TL9, a tenth microstrip TL10 and a blocking capacitor C1, wherein one end of the eighth microstrip TL8 is connected to the drain of the transistor, the other end of the eighth microstrip TL8 is connected to the ninth microstrip TL9 and the tenth microstrip TL10, the ninth microstrip TL9 is a parallel open-circuited microstrip, and the other end of the tenth microstrip TL10 is connected to a drain power supply.

* * * * *

UNITED STATES PATENT AND TRADEMARK OFFICE
CERTIFICATE OF CORRECTION

| | | |
|---|---|---|
| PATENT NO. | : 12,176,869 B2 | Page 1 of 1 |
| APPLICATION NO. | : 17/574238 | |
| DATED | : December 24, 2024 | |
| INVENTOR(S) | : Zhiqun Cheng et al. | |

It is certified that error appears in the above-identified patent and that said Letters Patent is hereby corrected as shown below:

In the Specification

In Column 8, Line 54, "$f_2$" should read "$f_1$".

Signed and Sealed this
Eighteenth Day of February, 2025

Coke Morgan Stewart
*Acting Director of the United States Patent and Trademark Office*